(12) United States Patent
Koide (10) Patent No.: US 10,848,143 B2
(45) Date of Patent: Nov. 24, 2020

(54) SEMICONDUCTOR INTEGRATED CIRCUIT

(71) Applicants: Kabushiki Kaisha Toshiba, Minato-ku, Tokyo (JP); Toshiba Electronic Devices & Storage Corporation, Minato-ku, Tokyo (JP)

(72) Inventor: Naotaka Koide, Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 16/551,975

(22) Filed: Aug. 27, 2019

(65) Prior Publication Data
US 2020/0295744 A1    Sep. 17, 2020

(30) Foreign Application Priority Data
Mar. 14, 2019 (JP) .................... 2019-047704

(51) Int. Cl.
*H03K 17/082*    (2006.01)
(52) U.S. Cl.
CPC ................ *H03K 17/0822* (2013.01)
(58) Field of Classification Search
CPC ........... H03K 17/00; H03K 17/04123; H03K 17/063; H03K 17/0822; H03K 17/168; H03K 17/687; H03K 17/6874
USPC ........................................................ 327/434
See application file for complete search history.

(56) References Cited

U.S. PATENT DOCUMENTS

| 9,588,541 | B1* | 3/2017 | Ho ......................... G05F 3/267 |
| 9,671,437 | B2 | 6/2017 | Akahane |
| 2006/0012932 | A1* | 1/2006 | Kitagawa ................. H02H 9/02 |
| | | | 361/93.1 |
| 2017/0063118 | A1* | 3/2017 | Kohout .................. H02J 7/0052 |
| 2019/0190512 | A1* | 6/2019 | Takuma ................... H02H 3/08 |

FOREIGN PATENT DOCUMENTS

| JP | 2007-078427 A | 3/2007 |
| JP | 2013-258549 A | 12/2013 |
| WO | 2014-199816 A1 | 12/2014 |

* cited by examiner

*Primary Examiner* — Lincoln D Donovan
*Assistant Examiner* — Dave Mattison
(74) *Attorney, Agent, or Firm* — White & Case LLP (57) ABSTRACT

According to one embodiment, there is provided a semiconductor integrated circuit including a first switch transistor, a first reference transistor, a differential amplifier circuit, and a current source. The first switch transistor is electrically connected between a first node on an input terminal side and a second node on an output terminal side. The first reference transistor is electrically connected between the first node and a third node. The differential amplifier circuit has a first input terminal electrically connected to the second node, a second input terminal electrically connected to the third node, and an output terminal electrically connected to a gate of the first switch transistor and a gate of the first reference transistor. The current source is electrically connected between the third node and a reference potential. The first reference transistor has dimensions smaller than dimensions of the first switch transistor.

20 Claims, 6 Drawing Sheets

SEMICONDUCTOR INTEGRATED CIRCUIT

CROSS-REFERENCE TO RELATED APPLICATIONS

This application is based upon and claims the benefit of priority from Japanese Patent Application No. 2019-047704, filed on Mar. 14, 2019; the entire contents of which are incorporated herein by reference.

FIELD

Embodiments described herein relate generally to a semiconductor integrated circuit.

BACKGROUND

In a semiconductor integrated circuit having a switch transistor provided between a power supply side and an output side, conduction between the power supply side and the output side is established when the switch transistor is turned ON. In this context, it is desirable to appropriately control current flowing out to the output side through the switch transistor.

DETAILED DESCRIPTION

In general, according to one embodiment, there is provided a semiconductor integrated circuit including a first switch transistor, a first reference transistor, a differential amplifier circuit, and a current source. The first switch transistor is electrically connected between a first node on an input terminal side and a second node on an output terminal side. The first reference transistor is electrically connected between the first node and a third node. The differential amplifier circuit has a first input terminal electrically connected to the second node, a second input terminal electrically connected to the third node, and an output terminal electrically connected to a gate of the first switch transistor and a gate of the first reference transistor. The current source is electrically connected between the third node and a reference potential. The first reference transistor has dimensions smaller than dimensions of the first switch transistor.

Exemplary embodiments of a semiconductor integrated circuit will be explained below in detail with reference to the accompanying drawings. The present invention is not limited to the following embodiments.

EMBODIMENTS

Figure 1:
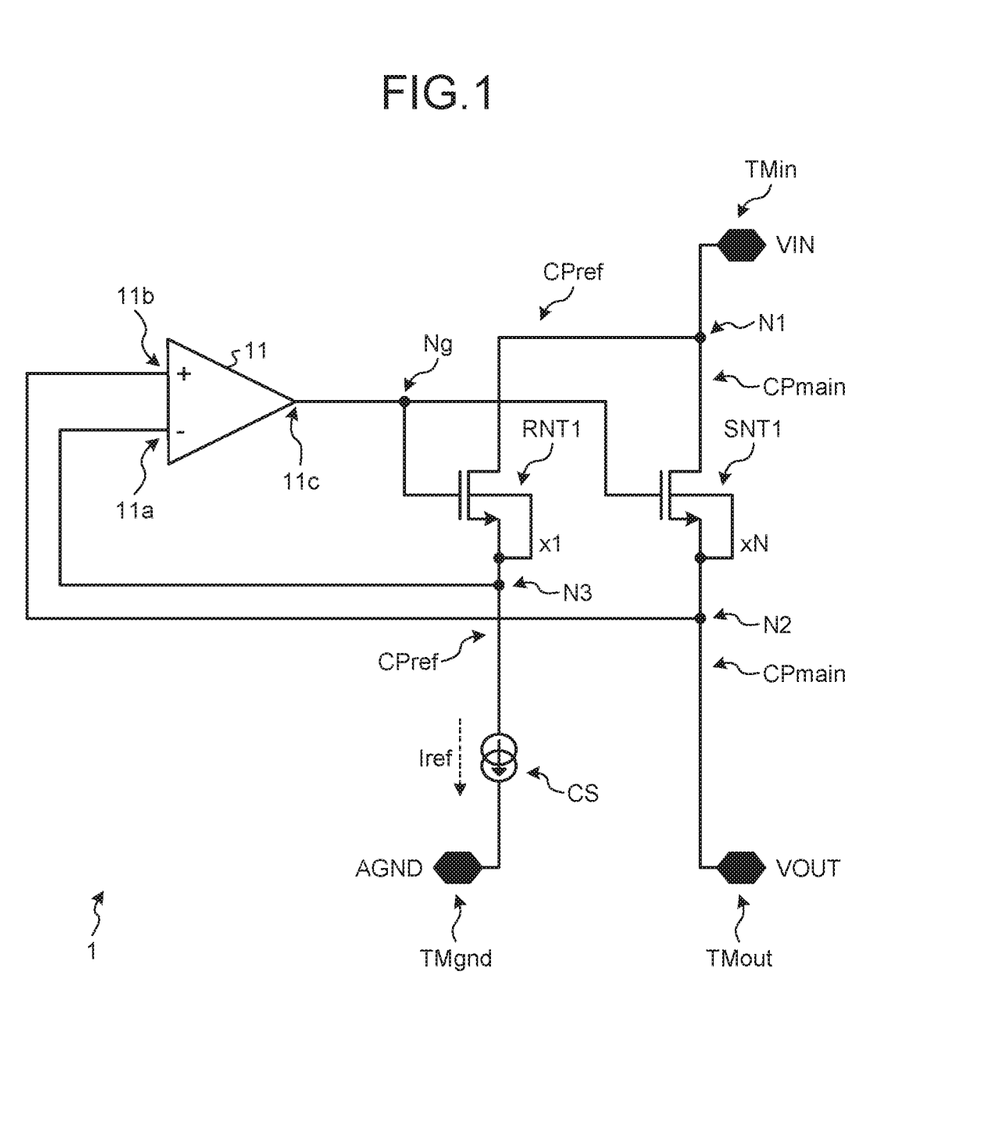
FIG. 1 is a circuit diagram illustrating a configuration of a semiconductor integrated circuit according to an embodiment.

A semiconductor integrated circuit according to an embodiment is electrically connected between the input terminal and the output terminal, and has an overcurrent protection function to control the current flowing from the input terminal to the output terminal. A semiconductor integrated circuit 1 may have a configuration as illustrated in FIG. 1. FIG. 1 is a circuit diagram illustrating a configuration of the semiconductor integrated circuit 1.

The semiconductor integrated circuit 1 has an input terminal TMin and an output terminal TMout, and is provided with a main current path CPmain from the input terminal TMin to the output terminal TMout, and a reference current path CPref from a node N1 on the main current path CPmain to a ground potential AGND. Input voltage VIN is supplied to the input terminal TMin, resulting in the semiconductor integrated circuit 1 causing current to flow from the input terminal TMin to the output terminal TMout, so that output voltage VOUT is output from the output terminal TMout.

For example, when a power supply (battery) of the input terminal TMin is connected and a load circuit is connected to the output terminal Tout, the semiconductor integrated circuit 1 may function as Load SW, E-Fuse IC, or the like that prevents overcurrent from flowing from the power supply to the load circuit.

The semiconductor integrated circuit 1 thus functioning performs determination on the overcurrent in the main current path CPmain, and performs determination on current control, based on such determination, in the reference current path CPref.

Specifically, the resistance of the reference current path CPref is increased over the resistance of the main current path CPmain. For example, resistance $R_{N1\_N3}$ between the node N1 and a node N3 in the reference current path CPref is set to be N (N is an integer of 2 or more) times as large as resistance $R_{N1\_N2}$ between the node N1 and a node N2 in the main current path CPmain. The node N3 is a node between the node N1 and a ground terminal TMgnd. The ground terminal TMgnd has the ground potential AGND. The node N2 is a node between the node N1 and the output terminal TMout.

Thus, the overcurrent flowing from the input terminal TMin to the output terminal TMout due to a load fluctuation or the like, can be determined by detecting that the potential of the node N2 has dropped.

The semiconductor integrated circuit 1 includes a switch transistor SNT1, a reference transistor RNT1, a differential amplifier circuit 11, and a current source CS. The switch transistor SNT1 is disposed on the main current path CPmain. Conduction between the input terminal TMin and the output terminal TMout is established when the switch transistor SNT1 is turned on. In the differential amplifier circuit 11, an inverting input terminal 11a is electrically connected to the node N3, a non-inverting input terminal 11b is electrically connected to the node N2, and an output terminal 11c is electrically connected to a node Ng. The node Ng is electrically connected to the gate of the switch transistor SNT1. The current source CS is disposed on the reference current path CPref. The current source CS causes reference current Iref to flow in the reference current path CPref. The reference current Iref corresponds to target current It that is desired to be detected in the main current path CPmain. The current source CS causes, for example, the reference current Iref represented by the following Formula 1 to flow in the reference current path CPref.

$$Iref = It/N \qquad \text{Formula 1}$$

Thus, if the resistance $R_{N1\_N3}$ between the node N1 and the node N3 is N times as large as the resistance $R_{N1\_N2}$ between the node N1 and the node N2, the potential of the node N3 is substantially equal to the target potential of the node N2 corresponding to the target current It. Specifically, the differential amplifier circuit 11 controls gate voltage of the switch transistor SNT1 to equalize the potential of the node N2 and the potential of the node N3, so that the current flowing in the main current path CPmain is controlled to be substantially equal to the target current It. Thus, when the overcurrent flows into the node N1 from the input terminal TMin, an overcurrent protection operation is implemented.

Specifically, when the potential of the node N2 drops, the differential amplifier circuit 11 lowers the gate voltage of the switch transistor SNT1 to make it difficult for current to flow the in the main current path CPmain, to restrict overcurrent flowing from the input terminal TMin to the output terminal TMout.

At this time, if the resistance $R_{N1\_N3}$ is implemented with a resistance element such as polysilicon and the resistance $R_{N1\_N2}$ is implemented with wiring resistance between the node N1 and the switch transistor SNT1, the ratio of the resistance $R_{N1\_N2}$ to the resistance $R_{N1\_N3}$ is likely to be different from N. When the ratio of the resistance $R_{N1\_N2}$ to the resistance $R_{N1\_N3}$ is different from N, accuracy of the determination on the overcurrent fluctuates, making it difficult to appropriately implement the overcurrent protection operation.

For example, if the ratio of the resistance $R_{N1\_N3}$ to the resistance $R_{N1\_N2}$ changes to be smaller than N, the overcurrent protection operation becomes excessively effective. As a result, the switch transistor SNT1 might be unable to make necessary current flow in the main current path CPmain. On the other hand, if the ratio of the resistance $R_{N1\_N3}$ to the resistance $R_{N1\_N2}$ changes to be larger than N, the overcurrent protection operation becomes less effective. As a result, the overcurrent might flow in the switch transistor SNT1 and the switch transistor SNT1 might be destroyed. Thus, a circuit (for example, the load circuit) connected to the output terminal Tout might be destroyed.

In view of this, trimming may be performed in the manufacturing process to increase the accuracy of determination on the overcurrent. However, this requires a large number of resistance elements to be provided as trimming elements, which may result in the semiconductor integrated circuit 1 having a larger area and increase in cost. Thus, it is desirable to implement the determination on the overcurrent with high accuracy without using the trimming elements.

In addition, the resistance $R_{N1\_N2}$ implemented with the wiring resistance between the node N1 and the switch transistor SNT1 may result in uneven arrangement of vias in the wiring between the node N1 and the node N2 and the like. This leads to formation of a portion where electric field concentration is likely to occur, which may result in a higher risk of problems such as breakdown due to electromigration.

Therefore, in the present embodiment, the semiconductor integrated circuit 1 achieves improvement in the accuracy of the determination on the overcurrent, with the reference current path CPref provided with the reference transistor RNT1 having dimensions smaller than (for example, 1/N of) the dimensions of the switch transistor SNT1.

Specifically, the switch transistor SNT1 is disposed between the node N1 and the node N2 in the main current path CPmain. The switch transistor SNT1 has the drain electrically connected to the node N1, the source electrically connected to the node N2, and the gate electrically connected to the node Ng.

The reference transistor RNT1 is disposed between the node N1 and the node N3 in the reference current path CPref. The reference transistor RNT1 has the drain electrically connected to the node N1, the source electrically connected to the node N3, and the gate electrically connected to the node Ng.

The reference transistor RNT1 has dimensions smaller than the dimensions of the switch transistor SNT1. For example, the reference transistor RNT1 has dimensions that are 1/N of the dimensions of the switch transistor SNT1. The reference transistor RNT1 and the switch transistor SNT1 may be configured to satisfy the following Formulae 2 to 4. In the formulae, Wr1 and Lr1 respectively represent the channel width and the channel length of the reference transistor RNT1, and Ws1 and Ls1 respectively represent the channel width and the channel length of the switch transistor SNT1.

$$Wr1 = (1/N) \times Ws1, Lr1 = Ls1 \qquad \text{Formula 2}$$

$$Lr1 = N \times Ls1, Wr1 = Ws1 \qquad \text{Formula 3}$$

$$Wr1/Lr1 = (1/N) \times (Ws1/Ls1) \qquad \text{Formula 4}$$

In this configuration, the gate potential and the drain potential are the same between the reference transistor RNT1 and the switch transistor SNT1. Thus, the determination on the current can be implemented with high accuracy by comparing their source voltages. Furthermore, the reference current Iref (see Formula 1) based on the target current It may be determined based on the dimensional ratio (1/N) between the reference transistor RNT1 and the switch transistor SNT1, and thus may be less likely to fluctuate. Thus, this configuration requires no trimming circuit. Furthermore, current with a small temperature fluctuation may be used as the reference current Iref, so that the determination on the overcurrent involves a smaller temperature fluctuation. Furthermore, the configuration substantially relies on comparison in gate-source voltage VGS between the reference transistor RNT1 and the switch transistor SNT1, which is less likely to be affected by fluctuations of the input voltage VIN.

As described above, in the embodiment, in the semiconductor integrated circuit 1, the reference transistor RNT1 is provided in the reference current path CPref, and the reference transistor RNT1 has dimensions smaller than (for example, 1/N of) the dimensions of the switch transistor SNT1. With this configuration, the accuracy of the determination on the overcurrent can be easily improved, so that the overcurrent protection operation can be appropriately performed. In other words, in the semiconductor integrated circuit 1, the current flowing to the output side through the switch transistor SNT1 can be appropriately controlled.

Figure 2:
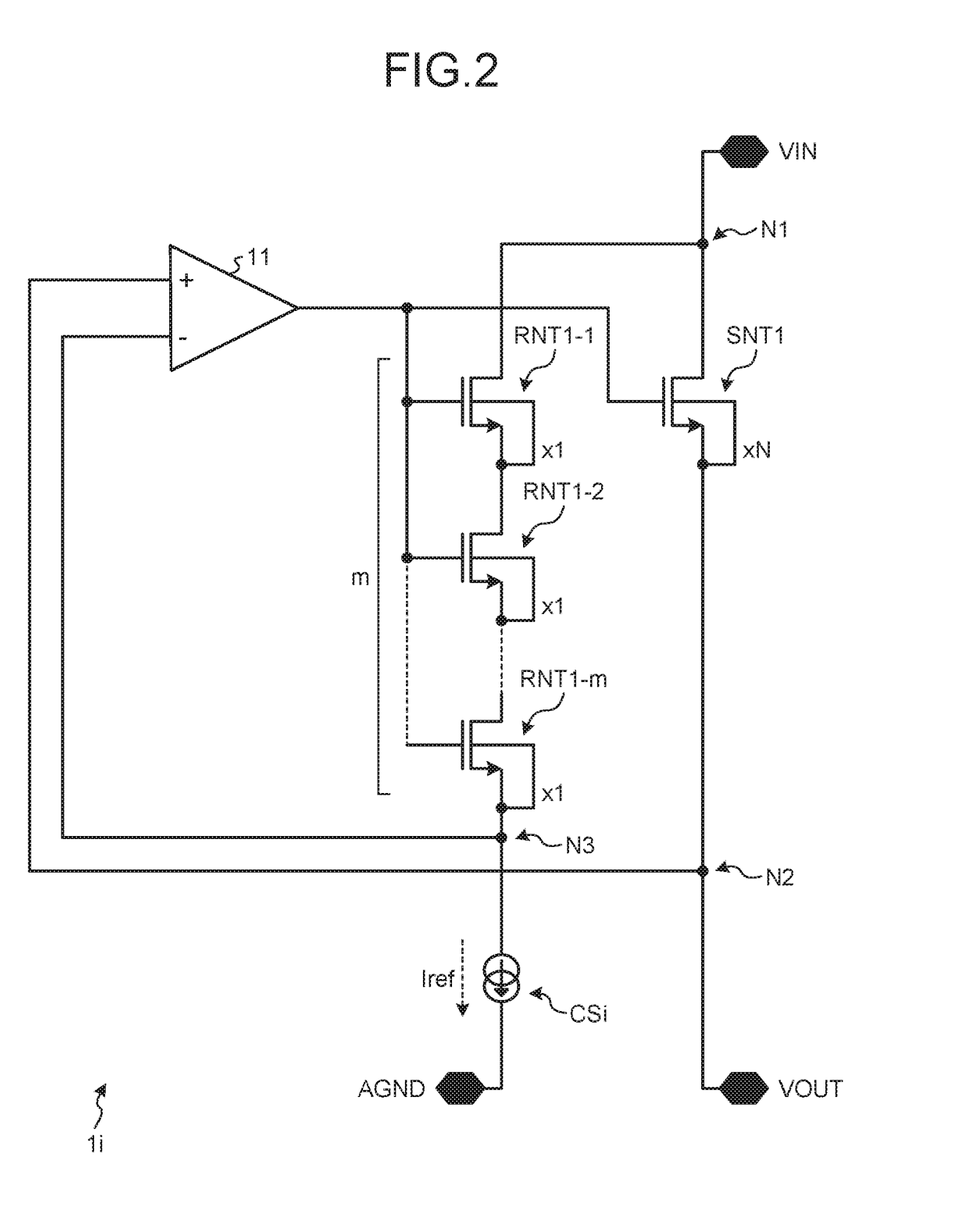
FIG. 2 is a circuit diagram illustrating a configuration of a semiconductor integrated circuit according to a first modification of the embodiment.

Note that a semiconductor integrated circuit 1$i$ elaborated to achieve lower power consumption may be implemented as illustrated in FIG. 2. FIG. 2 is a circuit diagram illustrating a configuration of the semiconductor integrated circuit 1$i$ according to a first modification of the embodiment. The semiconductor integrated circuit 1$i$ has m stages (m is any integer of 2 or more) of reference transistors RNT1-1 to RNT1-$m$ disposed between the node N1 and the node N3 in the reference current path CPref. The reference transistors RNT1-1 to RNT1-m each have dimensions that are the same as the dimensions of the reference transistor RNT1 according to the embodiment. With this configuration, the voltage drop due to the reference transistors RNT1-1 to RNT1-m in the reference current path CPref can be increased by a factor of m.

In response to this, a current source CSi causes reference current Iref, as represented by the following Formula 5, to flow in the reference current path CPref.

$$Iref=(It/N)\times 1/m \qquad \text{Formula 5}$$

Thus, the potential of the node N3 can be substantially equal to the target potential of the node N2 corresponding to the target current It, with the reference current Iref reduced to be 1/m of the reference current Iref in the embodiment. With this configuration, the semiconductor integrated circuit 1i can achieve lower power consumption. Instead of increasing the number of stages, the channel length may be increased (by m times, for example) to achieve the same effect.

Figure 3:
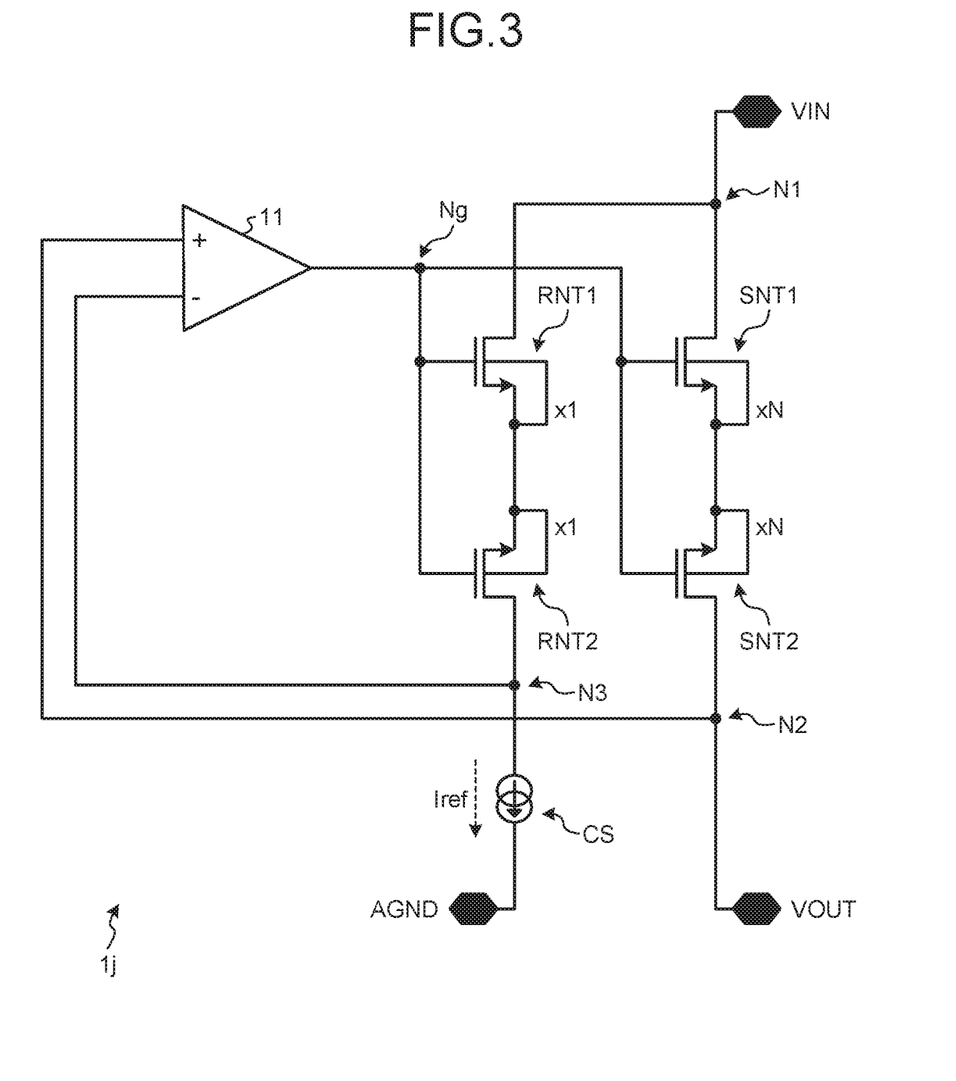
FIG. 3 is a circuit diagram illustrating a configuration of a semiconductor integrated circuit according to a second modification of the embodiment.

Furthermore, a semiconductor integrated circuit 1j elaborated to prevent backflow of current in the main current path CPmain may be implemented as illustrated in FIG. 3. FIG. 3 is a circuit diagram illustrating a configuration of the semiconductor integrated circuit 1j according to a second modification of the embodiment. In the semiconductor integrated circuit 1j, switch transistors SNT1 and SNT2, with their sources in common electrical connection, are disposed between the node N1 and the node N2 in the main current path CPmain. The switch transistor SNT1 has the drain electrically connected to the node N1, the source electrically connected to the source of the switch transistor SNT2, and the gate electrically connected to the node Ng. The switch transistor SNT2 has the drain electrically connected to the node N2, the source electrically connected to the source of the switch transistor SNT1, and the gate electrically connected to the node Ng. The switch transistors SNT1 and SNT2 each have dimensions that are the same as the dimensions of the switch transistor SNT1 according to the embodiment.

Reference transistors RNT1 and RNT2, with their sources in common electrical connection, are disposed between the node N1 and the node N3 in the reference current path CPref. The reference transistor RNT1 has the drain electrically connected to the node N1, the source electrically connected to the source of the reference transistor RNT2, and the gate electrically connected to the node Ng. The reference transistor RNT2 has the drain electrically connected to the node N3, the source electrically connected to the source of the reference transistor RNT1, and the gate electrically connected to the node Ng. The reference transistors RNT1 and RNT2 each have dimensions that are the same as the dimensions of the reference transistor RNT1 according to the embodiment.

In this configuration, backflow of current from the side of the output terminal TMout (that is, the load circuit side) to the side of the input terminal TMin (that is, the power supply side) may be prevented when the output voltage VOUT rises over the input voltage VIN for some reason with the switch transistors SNT1 and SNT2 being in an OFF state. Specifically, with respect to a direction of the current flowing from the output terminal TMout to the input terminal TMin, a parasitic diode (i.e., body diode) of the switch transistor SNT1 is in a forward direction, whereas a parasitic diode (i.e., body diode) of the switch transistor SNT2 is in a backward direction. Thus, current can be prevented from flowing back from the output terminal TMout toward the input terminal TMin.

Figure 4:
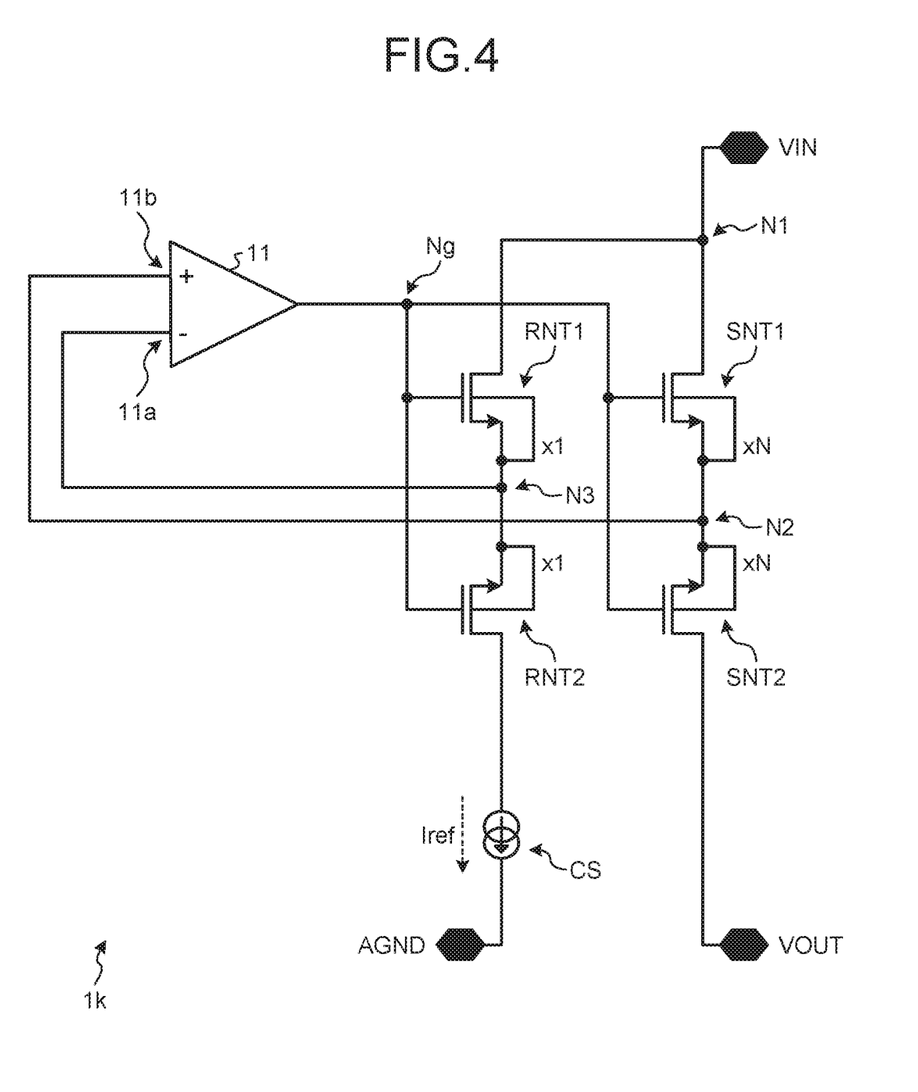
FIG. 4 is a circuit diagram illustrating a configuration of a semiconductor integrated circuit according to a third modification of the embodiment.

Furthermore, a semiconductor integrated circuit 1k elaborated not only for preventing the backflow of current in the main current path CPmain, but also for increasing EDS resistance of the differential amplifier circuit 11 can be implemented as illustrated in FIG. 4. FIG. 4 is a circuit diagram illustrating a configuration of the semiconductor integrated circuit 1k according to a third modification of the embodiment. Specifically, the positions of the nodes N2 and N3 illustrated in FIG. 3 are respectively changed to the position of the common source of the switch transistors SNT1 and SNT2 and the position of the common source of the reference transistors RNT1 and RNT2 as illustrated in FIG. 4.

With this configuration, a backflow prevention transistor (i.e., the switch transistor SNT2) with a larger area than an area of elements in the differential amplifier circuit 11 is provided between the output terminal TMout and the non-inverting input terminal lib of the differential amplifier circuit 11. This is expected to increase the ESD resistance of the non-inverting input terminal lib of the differential amplifier circuit 11.

Figure 5:
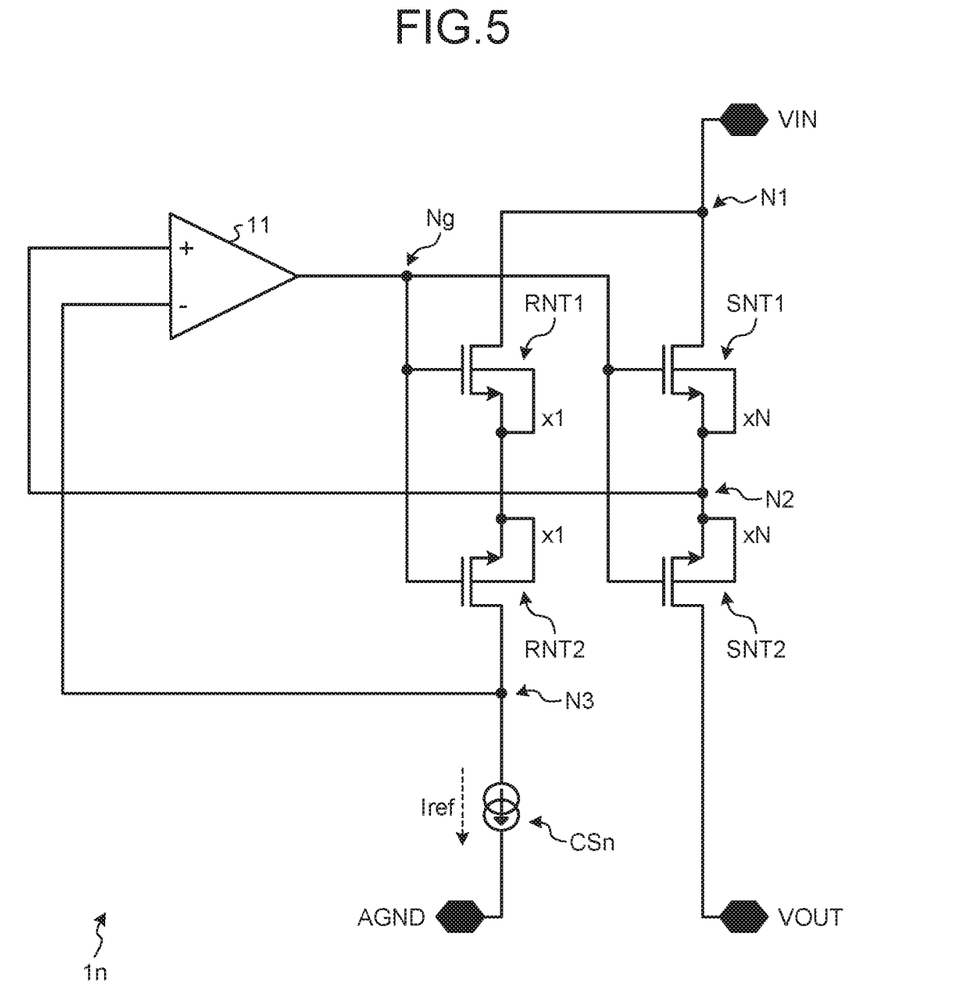
FIG. 5 is a circuit diagram illustrating a configuration of a semiconductor integrated circuit according to a fourth modification of the embodiment.

Furthermore, a semiconductor integrated circuit in elaborated not only for preventing the backflow of current in the main current path CPmain and increasing the EDS resistance of the differential amplifier circuit 11, but also for achieving lower power consumption may be implemented as illustrated in FIG. 5. FIG. 5 is a circuit diagram illustrating a configuration of the semiconductor integrated circuit in according to a fourth modification of the embodiment. Specifically, the position of node N3 illustrated in FIG. 4 is changed to a position between the reference transistor RNT2 and the current source CS as illustrated in FIG. 5.

With this configuration, the voltage drop due to the reference transistors RNT1 and RNT2 in the reference current path CPref can be doubled.

In response to this, a current source CSn causes reference current Iref, as represented by the following Formula 6, to flow in the reference current path CPref.

$$Iref=(It/N)\times 1/2 \qquad \text{Formula 6}$$

Thus, the potential of the node N3 can be substantially equal to the target potential of the node N2 corresponding to the target current It, with the reference current Iref reduced to be ½ of the reference current Iref in the embodiment. With this configuration, the semiconductor integrated circuit 1n can achieve lower power consumption. Instead of increasing the number of stages, the channel length may be increased (doubled, for example) to achieve the same effect.

Figure 6:
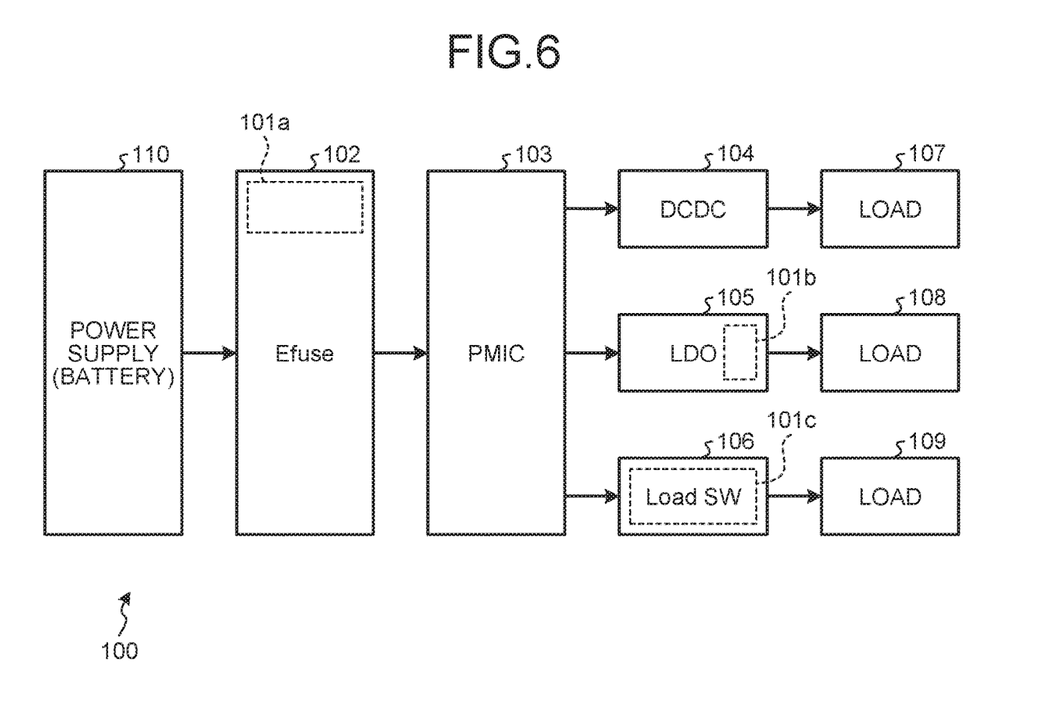
FIG. 6 is a diagram illustrating a configuration of a power supply system employing the semiconductor integrated circuit according to the embodiment and the modifications thereof.

In addition, the semiconductor integrated circuits according to the embodiment and the modifications thereof can be applied to any system requiring the overcurrent protection function, and can be applied to, for example, a location as illustrated in FIG. 6. FIG. 6 is a diagram illustrating a configuration of a power supply system 100 employing the semiconductor integrated circuit according to the embodiment and the modifications thereof. The power supply system 100 includes a power supply 110, an Efuse 102, a PMIC 103, a DCDC converter 104, a Low Drop OUT (LDO) 105, a Load SW 106, and load circuits 107 to 109. The Efuse 102 includes a semiconductor integrated circuit 101a having an overcurrent protection function. Any one of the semiconductor integrated circuits 1 to 1n can be used as the semiconductor integrated circuit 101a. The LDO 105 includes a semiconductor integrated circuit 101b having an overcurrent protection function, on the output side. Any one of the semiconductor integrated circuits 1 to 1n can be used as the semiconductor integrated circuit 101b. The Load SW 106 includes a semiconductor integrated circuit 101c having an overcurrent protection function. Any one of the semiconductor integrated circuits 1 to 1n can be used as the semiconductor integrated circuit 101c.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a first differential amplifier having a first input node, a second input node and an output node;
   a first switch transistor whose gate is electrically connected to the output node of the first differential amplifier, whose drain is electrically connected via a first node to an input terminal of the semiconductor integrated circuit, whose source is electrically connected via a second node to an output terminal of the semiconductor integrated circuit and to the first input node of the first differential amplifier;
   a first reference transistor whose gate is electrically connected to the output node of the first differential amplifier and to the gate of the first switch transistor, whose drain is electrically connected via the first node to the input terminal of the semiconductor integrated circuit, whose source is electrically connected via a third node to the second input node of the first differential amplifier;
   and
   a current source having a first end and a second end, the first end being electrically connected via the third node to the source of the first reference transistor, the second end being electrically connected to a reference potential, wherein
   the first reference transistor has dimensions smaller than dimensions of the first switch transistor, and
   the first differential amplifier controls a gate voltage of the first switch transistor to equalize the potential of the second node and the potential of the third node.

2. The semiconductor integrated circuit according to claim 1, wherein
   the dimensions of the first reference transistor are smaller than the dimensions of the first switch transistor such that the third node and the second node are able to be at a same potential when target current flows in the second node.

3. The semiconductor integrated circuit according to claim 1, wherein
   a resistance value between the first node and the third node is larger than a resistance value between the first node and the second node.

4. The semiconductor integrated circuit according to claim 1, wherein
   a gate and a drain of the first reference transistor are at a same potential, and
   a gate and a drain of the first switch transistor are at a same potential.

5. The semiconductor integrated circuit according to claim 1, wherein
   the semiconductor integrated circuit includes a plurality of the first reference transistors between the first node and the third node, and
   the output node of the first differential amplifier is electrically connected to the respective gates of the plurality of first reference transistors.

6. The semiconductor integrated circuit according to claim 1 further comprising:
   a second switch transistor electrically connected between the first switch transistor and the second node; and
   a second reference transistor electrically connected between the first reference transistor and the third node, wherein
   the output node of the first differential amplifier is further electrically connected to a gate of the second switch transistor and a gate of the second switch transistor,
   the first switch transistor and the second switch transistor have sources in common electrical connection, and
   the first reference transistor and the second reference transistor have sources in common electrical connection.

7. The semiconductor integrated circuit according to claim 1 further comprising:
   a second switch transistor electrically connected between the second node and the output terminal of the semiconductor integrated circuit; and
   a second reference transistor electrically connected between the third node and the current source, wherein
   the output node of the first differential amplifier is further electrically connected to a gate of the second switch transistor and a gate of the second reference transistor,
   the first switch transistor and the second switch transistor have sources in common electrical connection, and
   the first reference transistor and the second reference transistor have sources in common electrical connection.

8. The semiconductor integrated circuit according to claim 1 further comprising:
   a second switch transistor electrically connected between the second node and the output terminal of the semiconductor integrated circuit; and
   a second reference transistor electrically connected between the first reference transistor and the third node, wherein
   the output terminal of the first differential amplifier is further electrically connected to a gate of the second switch transistor and a gate of the second reference transistor,
   the first switch transistor and the second switch transistor have sources in common electrical connection, and
   the first reference transistor and the second reference transistor have sources in common electrical connection.

9. The semiconductor integrated circuit according to claim 1, wherein
   the current source causes current to flow, the current corresponding to a ratio of the dimensions of the first reference transistor to the dimensions of the first switch transistor.

10. The semiconductor integrated circuit according to claim 9, wherein
    the current source causes reference current to flow, the reference current being represented by Iref=It/N, where It represents target current to be flowed between the first node and the second node, and 1/N represents a ratio of the dimensions of the first reference transistor to the dimensions of the first switch transistor, N being an integer of 2 or more.

11. The semiconductor integrated circuit according to claim 5, wherein
the current source causes current to flow, the current corresponding to a ratio of the dimensions of each of the first reference transistors to the dimensions of the first switch transistor, and a number of the first reference transistors.

12. The semiconductor integrated circuit according to claim 11, wherein
the current source causes reference current to flow, the reference current being represented by Iref=(It/N)×1/m, where It represents target current to be flowed between the first node and the second node, 1/N represents the ratio of the dimensions of each of the first reference transistors to the dimensions of the first switch transistor, and m represents the number of the first reference transistors, N being an integer of 2 or more, m being an integer of 2 or more.

13. The semiconductor integrated circuit according to claim 6, wherein
the current source causes current to flow, the current corresponding to a ratio of the dimensions of the first reference transistor to the dimensions of the first switch transistor, and to a ratio of dimensions of the second reference transistor to dimensions of the second switch transistor.

14. The semiconductor integrated circuit according to claim 13, wherein
the current source causes reference current to flow, the reference current being represented by Iref=It/N, where It represents target current to be flowed between the first node and the second node, 1/N represents the ratio of the dimensions of the first reference transistor to the dimensions of the first switch transistor, and 1/N also representing the ratio of the dimensions of the second reference transistor to the dimensions of the first switch transistor, N being an integer of 2 or more.

15. The semiconductor integrated circuit according to claim 7, wherein
the current source causes current to flow, the current corresponding to a ratio of the dimensions of the first reference transistor to the dimensions of the first switch transistor, and to a ratio of dimensions of the second reference transistor to dimensions of the second switch transistor.

16. The semiconductor integrated circuit according to claim 15, wherein
the current source causes reference current to flow, the reference current being represented by Iref=It/N, where It represents target current to be flowed between the first node and the second node, 1/N represents the ratio of the dimensions of the first reference transistor to the dimensions of the first switch transistor, and 1/N also representing the ratio of the dimensions of the second reference transistor to the dimensions of the first switch transistor, N being an integer of 2 or more.

17. The semiconductor integrated circuit according to claim 8, wherein
the current source causes current to flow, the current corresponding to a ratio of the dimensions of the first reference transistor to the dimensions of the first switch transistor, and to a ratio of dimensions of the second reference transistor to dimensions of the first switch transistor.

18. The semiconductor integrated circuit according to claim 17, wherein
the current source causes reference current to flow, the reference current being represented by Iref=(It/N)×1/2, where It represents target current to be flowed between the first node and the second node, 1/N represents the ratio of the dimensions of the first reference transistor to the dimensions of the first switch transistor, and 1/N also representing the ratio of the dimensions of the second reference transistor to the dimensions of the first switch transistor, N being an integer of 2 or more.

19. The semiconductor integrated circuit according to claim 1, wherein
the input terminal is connectable with a power supply, and
the output terminal is connectable with a load circuit.

20. A power supply system comprising:
a power supply; and
the semiconductor integrated circuit according to claim 1 electrically connected to the power supply.

* * * * *